(12) United States Patent
Moors et al.

(10) Patent No.: US 7,202,934 B2
(45) Date of Patent: Apr. 10, 2007

(54) LITHOGRAPHIC APPARATUS AND DEVICE MANUFACTURING METHOD

(75) Inventors: Johannes Hubertus Josephina Moors, Helmond (NL); Erik Leonardus Ham, Steenbergen (NL); Gert-Jan Heerens, Schoonhoven (NL); Paulus Martinus Maria Liebregts, Veldhoven (NL); Erik Roelof Loopstra, Heeze (NL); Henri Gerard Cato Werij, Rotterdam (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/015,770

(22) Filed: Dec. 20, 2004

(65) Prior Publication Data

US 2006/0131682 A1   Jun. 22, 2006

(51) Int. Cl.
*G03B 27/52* (2006.01)
*G03B 27/42* (2006.01)
*G03F 7/00* (2006.01)

(52) U.S. Cl. ............................ 355/30; 355/53; 430/302
(58) Field of Classification Search .................. 355/30, 355/53, 55, 67; 359/818, 819; 430/302; 250/492.2

See application file for complete search history.

*Primary Examiner*—Peter B. Kim
(74) *Attorney, Agent, or Firm*—Pillsbury Winthrop Shaw Pittman LLP

(57) ABSTRACT

A lithographic apparatus arranged to transfer a pattern from a patterning device onto a substrate is disclosed. The apparatus includes an optics compartment that contains a patterned surface of the patterning device and an optical element, and a substrate compartment connected to the optics compartment by a connection that is arranged to pass a patterned beam of radiation from the optical element to the substrate. The apparatus also includes a first flush gas inlet arranged to supply a first flush gas into the connection, a second flush gas inlet adjacent to the patterned surface and arranged to supply a second flush gas into the optics compartment and to create a region adjacent the patterned surface in which the second flush gas flows in a direction with a component normal to and away from the patterned surface, and a gas pump arranged to pump the flush gases from the optics compartment.

12 Claims, 4 Drawing Sheets

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction), while synchronously scanning the substrate parallel or anti-parallel to this direction. It is also possible to transfer the pattern from the patterning device to the substrate by imprinting the pattern onto the substrate.

There has been a trend to use increasingly shorter wavelengths in the beam of radiation to increase resolution. This has led to the use of reflective optical elements (mirrors) and an open beam path from the reticle to the substrate, instead of refractive optical elements (glass lenses) and a beam path that passes through windows between different compartments of the lithographic apparatus. At (E)UV wavelengths, effective projection of the pattern would otherwise be impossible, and of course even at longer wavelengths, the omission of obstructions, such as windows, may improve the imaging effectiveness.

However, the omission of windows between different compartments of the lithographic apparatus may have the undesirable side effect that contaminants, in particular contaminant particles that emanate from the substrate during illumination, such as molecules, may travel from the substrate to the optical elements and the reticle or mask, which shortens the useful lifetime of the optical elements and the reticle or mask.

One solution that has been used to reduce this problem is the introduction of a gas lock in the path of the beam between the substrate and the optical elements. According to this technique, the apparatus contains compartments that hold the optical elements and the substrate, respectively. The beam passes through a connection between these compartments. Most of the apparatus is evacuated to a low gas pressure, but gas is intentionally introduced into the connection. The gas traps contaminants that emanate from the substrate. Gas that reaches the optics compartment is pumped out, so that contaminants in the optic compartment may be pumped out with the gas.

The gas lock solution may be successful in preventing contaminants from follow a free trajectory from the substrate to the optical elements. However, it has been found that the flow of gas from the gas lock through the optics compartment to a pump may lead to new problems at the reticle or mask. Particles that are generated by mechanical motions in the optics compartment may be accelerated by the gas flow towards the patterned surface of the reticle or mask. Due to the low pressure in the optics compartment, the gas flow may not prevent these particles from hitting the patterned surface. This may degrade the patterned surface.

SUMMARY

It is desirable to reduce particle contamination of a surface of the reticle or mask when the surface is exposed to the atmosphere of an optics compartment of the lithographic apparatus that is accessible to gas from a gas lock between the optics compartment and the substrate.

According to an embodiment of the invention, there is provided a lithographic apparatus that is arranged to transfer a pattern from a patterning device onto a substrate. The apparatus includes an optics compartment that contains a patterned surface of the patterning device, and an optical element. The apparatus also includes a substrate compartment connected to the optics compartment by a connection that is arranged to pass a patterned beam of radiation from the optical element to the substrate, a first flush gas inlet arranged to supply a first flush gas into the connection, and a second flush gas inlet adjacent to the patterned surface and arranged to supply a second flush gas into the optics compartment and to create a region adjacent the patterned surface in which the second flush gas flows in a direction with a component normal to and away from the patterned surface. The apparatus further includes a gas pump arranged to pump the flush gases from the optics compartment.

According to an embodiment of the invention, there is provided a device manufacturing method. The method includes patterning a beam of radiation with a patterned surface of a patterning device in an optics compartment, and projecting the patterned beam of radiation from the patterned surface to a substrate in a substrate compartment. The patterned beam of radiation passes through a channel between the optics compartment and the substrate compartment. The method also includes flowing a first flush gas into the channel, flowing a second flush gas into the optics compartment so as to create a region adjacent the patterned surface in which a direction of gas flow has a component in a direction normal to and away from the patterned surface, and pumping the first and second gases from the optics compartment.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
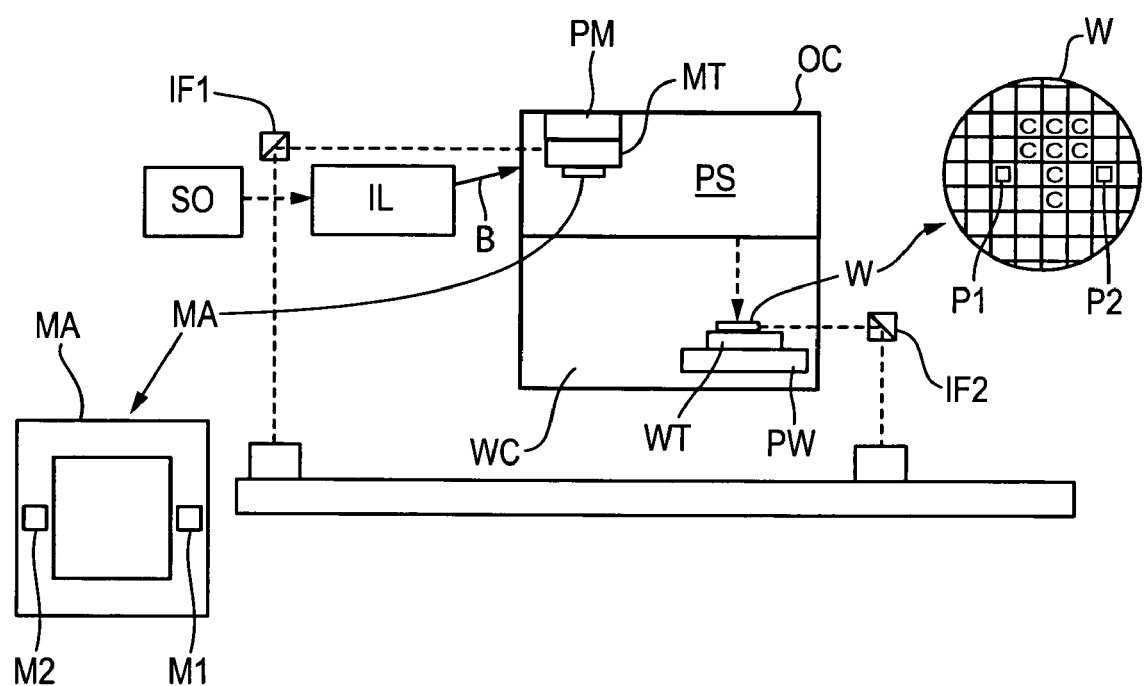
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation), a support structure (e.g. a mask table) MT constructed to support a patterning device (e.g. a mask) MA and connected to a first positioner PM configured to accurately position the patterning device in accordance with certain parameters, a substrate table (e.g. a wafer table) WT constructed to hold a substrate (e.g. a resist-coated wafer) W and connected to a second positioner PW configured to accurately position the substrate in accordance with certain parameters, and a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT supports, i.e. bears the weight of, the patterning device MA. It holds the patterning device in a manner that depends on the orientation of the patterning device, the design of the lithographic apparatus, and other conditions, such as, for example, whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example, with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables, while one or more other tables are being used for exposure.

The lithographic apparatus may also be of a type in which at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases, the source may be an integral part of the lithographic apparatus, for example, when the source is a mercury lamp. The source SO and the illuminator IL, together with the beam delivery system if required, may be referred to as a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held against the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus may be used in at least one of the following example modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally, a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
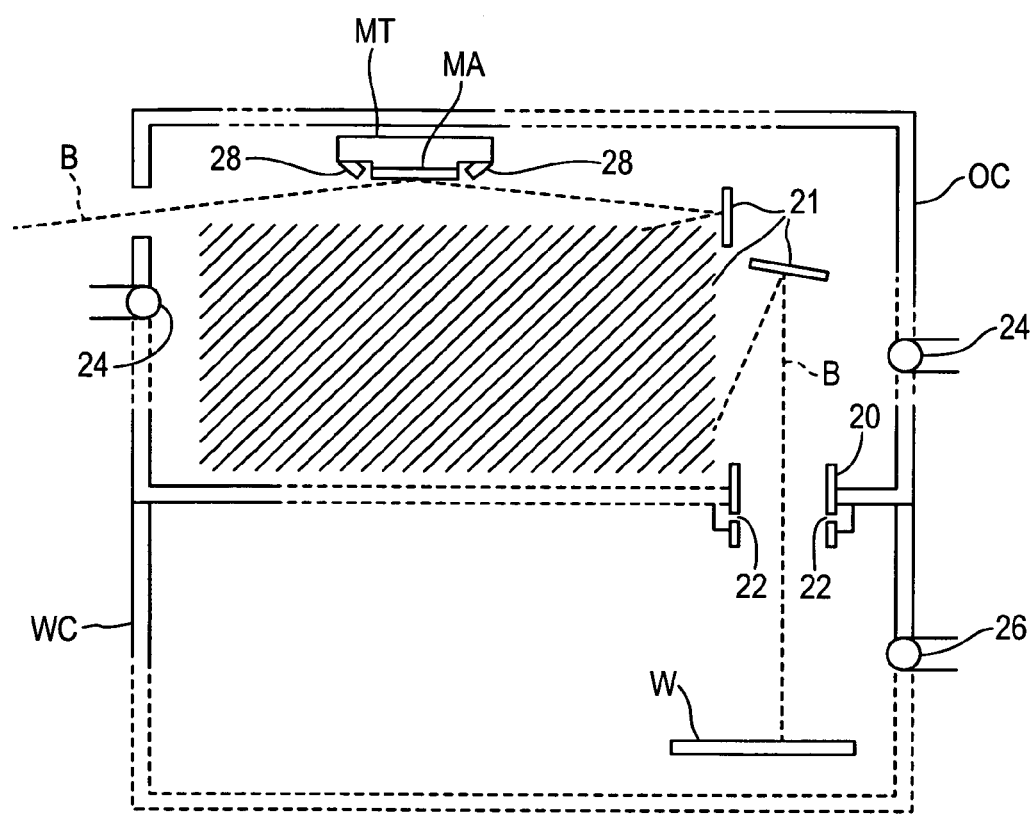
FIG. 2 depicts an operation of a gas lock of the apparatus of FIG. 1.

FIG. 2 schematically illustrates operation of a gas lock between substrate W and reticle assembly MA. Reticle assembly MA may include the reticle per se, but optionally a pellicle may be provided (a thin protective layer over the patterned surface of the reticle), but only if the wavelength of the beam allows this. The photolithographic apparatus includes an optics compartment OC, a substrate compartment WC and an open channel connection 20 between the optics compartment OC and the substrate compartment WC. Reticle assembly MA and optical elements 21 (the majority of which are shown by cross hatching for the sake of simplictity) are located in optics compartment OC. Optics compartment OC has walls that close optics compartment OC off from a remainder of the photolithographic apparatus, in particular from the substrate compartment WC. In the walls of optics compartment OC, openings are provided with a size that is generally no more than needed for passing the beam into and out of optics compartment OC. Similarly, substrate compartment WC has walls that close substrate compartment WC off from the remainder of the lithographic apparatus. First gas inlets 22 debouch into channel connection 20, and pumps 24, 26 have inputs coupled to optics compartment OC and substrate compartment WC, respectively. Second gas inlet 28 debouches near the surface of reticle assembly MA. A gas source (not shown) is coupled to the first and second inlets 22, 28.

In operation, during illumination of substrate W, the patterned beam B travels from reticle assembly MA through optics chamber OC and channel connection 20 to substrate W. Gas is supplied from first inlets 22 into channel connection 20. The gas in channel connection 20 serves to "catch" particles that emanate from substrate W, thereby preventing the particles from following a trajectory towards optical elements 21. Gas (which drags along caught particles) that reaches optics compartment OC is pumped out with pumps 24. Thus, a gas flow occurs with flow lines through optics compartment OC from channel connection 22 to pumps 24.

Second inlets 28 introduce a second gas flow into optics compartment OC. Second inlets 28 are arranged to introduce a gas flow directed away from the surface of reticle assembly MA. This flow is realized by locating second inlet 28 adjacent to reticle assembly MA, designed to provide a sufficient flow strength to drive away particles that reach reticle assembly MA from channel connection 20.

In this way, different gas flows are introduced into optics compartment OC, including a gas flow from channel connection 20 and a gas flow from second inlets 28. The location of second inlets 28 and the strength of gas flow from these inlets are selected so that the two gas flows substantially meet at a distance from reticle assembly MA. The gas flow from channel connection 20 contains contaminant particles. The gas flow from second inlet 28 does not contain such particles, at least until this gas flow mixes with the gas flow from channel connection. As a result, deposition of paticles onto reticle assembly MA may be substantially prevented.

Figure 3A:
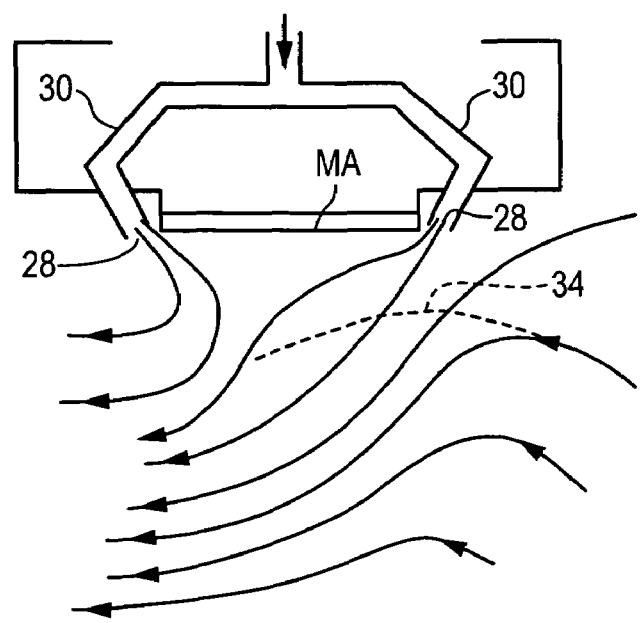
FIGS. 3a,b schematically show a secondary gas inlet arrangement.
Figure 3B:
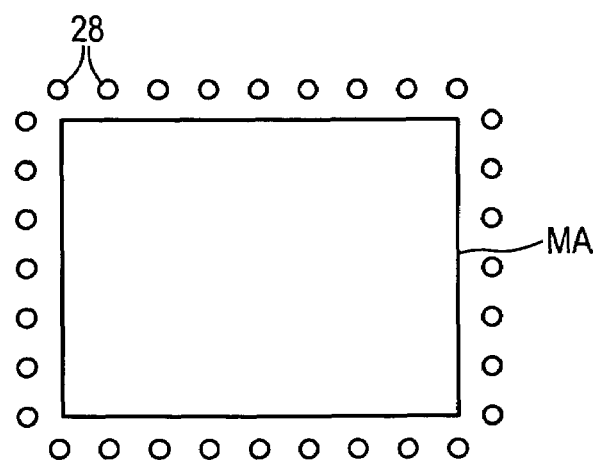

FIGS. 3a,b schematically show a second inlet arrangement and corresponding gas flow. The gas flow is introduced from locations that surround the reticle assembly MA with a flow direction that is substantially perpendicular to the main surface of the reticle assembly, but inclined slightly inward, towards a region in front of the main surface of reticle assembly MA. In the embodiment shown, at least near the mouths of second inlets 28, a plurality of conduits 30 may be used that lie in parallel to each other with mouths located in rows along the edges of reticle assembly MA. In an alternative embodiment, the mouth of conduit 30 has an elongated shape, having its longitudinal axis extending in parallel with a virtual plane through the main surface of reticle assembly MA over a width that is at least equal to a width of the surface of reticle MA.

It should be appreciated that the apparatus is operated with near vacuum conditions in the optics compartment OC. Although gas is inevitably present in optics compartment OC due to the use of the gas lock between the optics compartment OC and the substrate compartment WC, the pressure of this gas in optics compartment is typically quite low, for example, in a range of about $10^{-3}$ to about 1 millibar. Also, inevitably, particles are generated in the optics compartment, for example, as a result of relative movement of mechanical components, such as the reticle assembly, a reticle handler (not shown) for robotic replacement of reticles, mirror actuators (not shown), aperture blade handlers (not shown), etc. Under ideal vacuum conditions, these particles would follow ballistic tracks, which means that particles reaching the surface of the reticle assembly may be avoided by suitable positioning of the reticle assembly. On the other hand, under normal atmospheric pressures, these particles typically flow with the gas, which would prevent them from reaching the surface of the reticle assembly. However, at the near-vacuum pressures used, a considerable fraction of the particles will, on one hand, be accelerated by the gas flow (due to introduction of gas in the gas lock and pumping in the optics compartment OC), but, on the other hand, the particles may not exactly follow the gas flow. This entails the risk that particles may be brought into close proximity of the surface of the reticle assembly MA and launched toward the reticle assembly MA.

Figure 4:
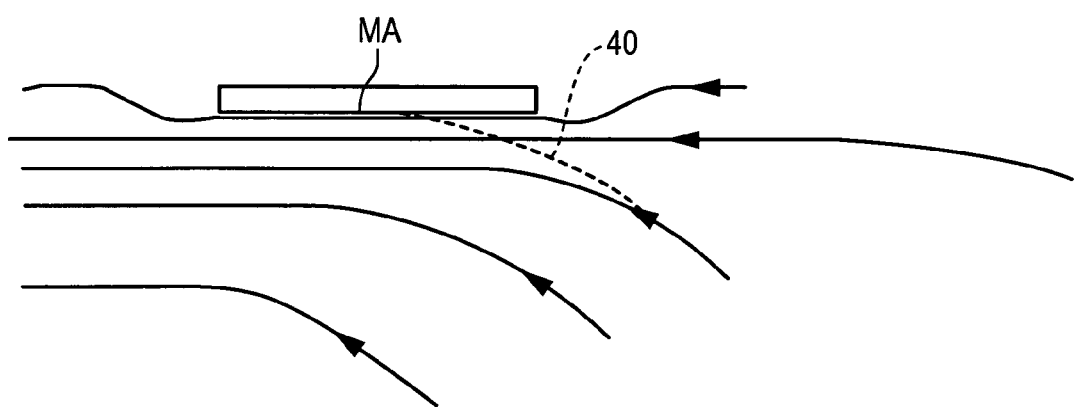
FIG. 4 illustrates gas flow in the absence of additional inlets.

FIG. 4 schematically illustrates this effect in the absence of an additional gas inlet near reticle assembly MA. Flow lines are shown qualitatively. As can be seen, these flow lines do not exhibit a significant flow in a direction away from the surface of reticle assembly MA. In particular, the flow speed component normal to the surface of reticle assembly and away from that surface is less than the speeds of the particles relative to the gas flow (typically a few millimeters per second) that are possible at the pertaining pressures. As a result, particles may reach the surface of reticle assembly MA. A track 40 of a particle that deviates from the gas flow lines where these lines are curved illustrates how a particle may reach the surface of reticle assembly MA. This may be prevented when additional gas inlets are provided near reticle assembly MA, so as to introduce a speed component of the gas flow along the normal to the surface of reticle assembly MA with a speed higher than the typical speeds of the particles relative to the gas flow. Such a component serves to deflect the particles before they may reach the surface of reticle assembly MA, even though near-vacuum pressures are used that are insufficient to force the particles to follow the flow completely.

FIG. 3a schematically shows gas flow when additional inlets are used. The additional gas flow has a flow direction that is substantially perpendicular to the main surface of the reticle assembly, but inclined slightly inward, towards a region in front of the main surface of reticle assembly MA. The gas flow strength from second inlet 28 is set to a value so that, at least in a region over the surface of reticle MA, the gas flow velocity has a component along the normal to reticle surface that is directed away from reticle surface. As a result, particles that flow towards the surface of reticle assembly MA have to enter this region, where their velocity component towards the reticle assembly is reversed, so that these particles do not reach the surface of the reticle assembly MA. Track 34 of a particle schematically illustrates this. Although this particle does not fully follow the flow of the gas (due to the low pressure), it is unable to travel any significant distance against the flow direction in the region near the surface of reticle assembly MA.

It will be appreciated that it may depend on the flow strength of the flush gas (velocity and density of flush gas) whether the flush gas prevents contamination from reaching the patterned surface. The minimum flow strength depends on various factors, such as the geometrical configuration of second inlets 28, the size of the reticle assembly MA, the distance between channel 20, and the reticle assembly and the location where pump 26 is coupled to the optics compartment OC. An adequate flow strength may be selected experimentally, for example, by using different dummy reticles MA at different flow strengths, followed by analysis of the surface of the dummy reticles to determine the amount of contaminant particles on the surface. Also, the flow strength may be adjustable, so that it may be turned up when it is found that too much contamination reaches reticles during production. However, it should be realized that other methods of selecting the flow strength, such as flow measurements, may be used. Furthermore, it should be realized that an excessively strong flow is not needed when the reticle MA is located above channel 20 and preferably with its patterned surface facing downward in optics compartment OC. In this case, gravity should prevent that contaminant particles from reaching reticle MA, as long as there is no flush gas flow toward reticle MA.

In one embodiment, the gas that is introduced through first inlet 22 has the same composition as the gas that is introduced through second inlet 28. This gas may be made up substantially of argon, for example. In this case, the gas is preferably supplied from a common gas source to first and second inlets 22, 28, but alternatively separate sources may be used. In another example, gases of different compositions may be used.

Similar additional gas inlets may be provided near mirror surfaces in optic chamber, to prevent particles from reaching these surfaces. An embodiment has been shown where the surface to be protected (the surface of reticle assembly MA) is directed downward. This may have the advantage that the gravitational pull will aid in drawing particles away from the surface. Thus, less additional gas flow may be needed. However, in other embodiments, the surface that is being protected may be directed vertically or even upward. In the latter case, the additional gas flow prevents particles from falling onto the surface. Also, the reticle assembly is preferably located higher than the gas lock and/or the pump. This may reduce gas flow towards the reticle assembly in a path from the gas lock towards the pump.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure, or a combination thereof. The patterning device is moved out of the resist, leaving a pattern in it after the resist is cured.

The terms "radiation" and "beam" as used herein encompass all types of electromagnetic radiation, including ultraviolet (UV) radiation (e.g. having a wavelength of or about 365, 248, 193, 157 or 126 nm), and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus arranged to transfer a pattern from a patterning device onto a substrate, the apparatus comprising:
   an optics compartment that contains a patterned surface of the patterning device and an optical element;
   a substrate compartment connected to the optics compartment by a connection that is arranged to pass a patterned beam of radiation from the optical element to the substrate;
   a first flush gas inlet arranged to supply a first flush gas into said connection;
   a second flush gas inlet adjacent to the patterned surface and arranged to supply a second flush gas into the optics compartment and to create a region adjacent the patterned surface in which the second flush gas flows in a direction with a component normal to and away from the patterned surface; and
   a gas pump arranged to pump the flush gases from the optics compartment.

2. A lithographic apparatus according to claim 1, wherein the second flush gas inlet comprises a row of mouths located in parallel to an edge of the patterned surface.

3. A lithographic apparatus according to claim 1, further comprising a support for the patterning device, the support structure being arranged to hold the patterning device with the patterned surface facing in a direction with a component towards a direction of gravitational pull.

4. A lithographic apparatus according to claim 3, wherein the support is located to hold the patterning device above the channel connection.

5. A lithographic apparatus according to claim 1, wherein the optics compartment contains a mirror for reflecting the patterned beam of radiation, and the apparatus further comprises a third flush gas inlet adjacent to the mirror and arranged to supply a third flush gas into the optics compartment and to create a region adjacent the mirror in which the third flush gas flows in a direction with a component normal to and away from a mirror surface.

6. A lithographic apparatus according to claim 1, wherein the first flush gas comprises argon.

7. A lithographic apparatus according to claim 1, wherein the second flush gas comprises argon.

8. A device manufacturing method comprising:
   patterning a beam of radiation with a patterned surface of a patterning device in an optics compartment;
   projecting the patterned beam of radiation from the patterned surface to a substrate in a substrate compartment, the patterned beam of radiation passing through a channel between the optics compartment and the substrate compartment;
   flowing a first flush gas into the channel;
   flowing a second flush gas into the optics compartment so as to create a region adjacent the patterned surface in which a direction of gas flow has a component in a direction normal to and away from the patterned surface; and
   pumping the first and second gases from the optics compartment.

9. A device manufacturing method according to claim 8, further comprising holding the patterning device with its patterned surface facing downward during said projecting.

10. A device manufacturing method according to claim 8, wherein a gas pressure in the optics compartment is in a range of about 0.001 to about 1 millibar.

11. A device manufacturing method according to claim 8, wherein the first flush gas comprises argon.

12. A device manufacturing method according to claim 8, wherein the second flush gas comprises argon.

* * * * *